(12) United States Patent
Katagiri et al.

(10) Patent No.: US 8,866,371 B2
(45) Date of Patent: Oct. 21, 2014

(54) ELECTRIC FIELD DISCHARGE-TYPE ELECTRON SOURCE

(71) Applicant: Hitachi High-Technologies Corporation, Tokyo (JP)

(72) Inventors: Souichi Katagiri, Tokyo (JP); Takashi Ohshima, Tokyo (JP); Sukehiro Ito, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/239,144

(22) PCT Filed: Sep. 24, 2012

(86) PCT No.: PCT/JP2012/074319
§ 371 (c)(1),
(2), (4) Date: Feb. 16, 2014

(87) PCT Pub. No.: WO2013/047397
PCT Pub. Date: Apr. 4, 2013

(65) Prior Publication Data
US 2014/0197725 A1    Jul. 17, 2014

(30) Foreign Application Priority Data

Sep. 26, 2011 (JP) ................................. 2011-208402
Mar. 19, 2012 (JP) ................................. 2012-061395

(51) Int. Cl.
*H01J 1/14*    (2006.01)
*H01J 19/06*    (2006.01)
*H01K 1/04*    (2006.01)

(52) U.S. Cl.
USPC ........................... 313/345; 313/310; 313/341

(58) Field of Classification Search
CPC .............. H01J 2237/06316; H01J 1/14; H01J 2201/30426; H01J 2237/06341
See application file for complete search history.

(56) References Cited

U.S. PATENT DOCUMENTS 5,449,968 A    9/1995    Terui et al.

FOREIGN PATENT DOCUMENTS

| JP | 59-049065 A | 3/1984 |
| JP | 06-076731 A | 3/1994 |
| JP | 2003-031170 A | 1/2003 |

OTHER PUBLICATIONS

Steele, D., et al., "The structure of cubic $ZrO_2$:$YO_{1.5}$ solid solutions by neutron scattering", J. Phys. C: Solid State Phys., vol. 7, 1974, pp. 1-11, Great Britain.

*Primary Examiner* — Donald Raleigh
(74) *Attorney, Agent, or Firm* — Miles & Stockbridge P.C.

(57) ABSTRACT

Increasing the volume or weight of zirconia which is a diffusion and supply source, to extend the life of a field-emission type electron source causes a problem that the diffusion and supply source itself or a tungsten needle is easily subjected to damage. As another problem, although it is considered to form the diffusion and supply source using a thin film to avoid the above-described problem, it is difficult to stably obtain practical life exceeding 8,000 hours. It has been found that practical life exceeding 8,000 hours is stably obtained by providing a field-emission type electron source that has no chips or cracks in a diffusion and supply source and that can extend life with a little bit of an increase in the amount of the diffusion and supply source.

10 Claims, 17 Drawing Sheets

ELECTRIC FIELD DISCHARGE-TYPE ELECTRON SOURCE

TECHNICAL FIELD

The present invention relates to an electron source used in an electron microscope, semiconductor inspection equipment, an Auger electron spectrometer, an electron lithography apparatus, etc. More particularly, the present invention relates to a life extension technique for a field-emission type electron source.

BACKGROUND ART

A conventional Scanning Electron Microscope and a conventional Transmission Electron Microscope accelerate an electron beam emitted from an electron gun composed of a cold-cathode field-emission type or a field-emission type electron source, to form a fine electron beam using electron lenses, and scan the electron beam over a sample using a scanning deflector, as a primary electron beam. In the case of the SEM, obtained secondary electrons or reflected electrons are detected, thereby obtaining an image. In the case of the TEM, an image of electrons transmitted through the sample is imaged. In the electron source of the electron microscopes, zirconia may be allowed to be adhered to a side surface of a needle which is obtained by sharpening a tip of a single-crystal tungsten wire rod, and an electric field may be applied to the needle tip in a heated state to emit electrons. This is called a field-emission type electron source or a Schottky electron source.

The field-emission type electron source supplies zirconium and oxygen onto a tungsten crystal plane (100) by thermal diffusion to form a region with a low work function. The heating temperature is on the order of 1600 K to 1900 K. Normally, the field-emission type electron source is used at 1700 K to 1800 K. In PTL 1, by providing a crystal plane (100) at a tip of a tungsten needle and applying a strong electric field, thermoelectrons that surpass a potential barrier and electrons transmitted by the tunnel effect can be extracted.

A basic configuration of the field-emission type electron source is such that a needle having at its tip a crystal orientation (100) of single-crystal tungsten is spot-welded and fixed to a heating tungsten hairpin, a part of which includes zirconia which is a diffusion and supply source. The diffusion and supply source is formed around the needle as viewed from the tip side of the needle. In NPL 1, it is known that zirconia takes three types of allotropes according to heating temperature, that is, monoclinic, tetragonal, and cubic structures. PTL 2 discloses formation of a diffusion and supply source using a thin film. PTL 3 discloses a method in which a solution where zirconium hydride fine particles are mixed in an organic solvent is allowed to be adhered to a side outer portion of a tungsten needle using a dropper, and is heated under vacuum and sintered, by which a diffusion and supply source is formed.

CITATION LIST

Patent Literatures

PTL 1: JP 59-49065 A
PTL 2: JP 2003-31170 A
PTL 3: JP 6-76731 A

Non-Patent Literature

NPL 1: D. Steele and B. E. F. Fender, J. Phys. C: Solid State Phys., 7, 1 (1974)

SUMMARY OF INVENTION

Technical Problem

However, when the tungsten needle is heated by allowing a current to pass through the hairpin, zirconia which is the diffusion and supply source is consumed. When the zirconia disappears eventually, it gets into trouble emitting electrons, reaching the end of life. In the case of extending the life of the field-emission type electron source, normally, the volume or weight of zirconia which is the diffusion and supply source is increased. However, trouble occurs due to a phenomenon characteristic to zirconia which will be described next.

Since, in particular, a shift from a monoclinic crystal to a tetragonal crystal occurs at 1100° C. (on the order of 1400 K), when the temperature increases from 1700 K to 1800 K which are normal heating temperatures of the field-emission type electron source, or when heating is stopped and the temperature is brought back to room temperature, the temperature goes through a shift temperature range. Hence, due to a change in the volume of the diffusion and supply source (zirconia), there is a problem that the diffusion and supply source itself or the tungsten needle is easily subjected to damage.

It is difficult for the field-emission type electron sources to stably obtain practical life exceeding 8,000 hours.

An object of the present invention is therefore to provide an field-emission type electron source that has no chips or cracks in a diffusion and supply source and that can extend life with a little bit of an increase in the amount of the diffusion and supply source.

Solution to Problem

To solve the above-described problem, the present invention includes a field-emission type electron source in which the form (thickness and length) of formation of a diffusion and supply source falls within a predetermined range. More desirably, the object is attained by including a field-emission type electron source in which a predetermined range is determined for each temperature to be used.

A physical and chemical mechanism for determining a predetermined range will be described.

A field-emission type electron source in which zirconia is formed on a side outer surface of a single-crystal tungsten needle is disposed in vacuum. In this state, the tungsten needle is heated to the order of 1800 K and oxygen or air is introduced, by which oxygen atoms are captured in the zirconia, and at the same time, diffusion starts on a tungsten surface. In the surface diffusion, there is a zirconium monatomic layer on the uppermost surface, and there is a coexistence region of many oxygen atoms and tungsten on a surface under the uppermost surface. When a certain amount of oxygen is captured, oxygen atoms cannot enter the zirconia and a reaction that the zirconium diffused on the tungsten surface is oxidized and removed becomes noticeable, which, in reverse, inhibits diffusion. At this point in time, the introduction of oxygen or air is stopped. Thereafter, heating is continuously performed for a while to wait for diffusion to sufficiently proceed to a (100) plane at the tip of the tungsten needle. Then, an electric field is applied to the tip of the tungsten needle, by which electron emission starts. This is a normal use state. Thereafter, a stable electron emission state continues until the diffusion and supply source expires. The surface-diffused zirconium is evaporated or undergoes an oxidation-reduction reaction with gas molecules, etc., present therearound and thereby disappears, and oxygen is emitted from holes where the zirconium is lost, and is consumed. The holes for the disappeared zirconium are recovered independently by new zirconium to be surface-diffused, and thus, it does not give a great defect. Since such a phenomenon occurs intermittently and continuously, the zirconium is gradually consumed. Hence, to extend life, the volume of zirconia is set to be large.

According to the present invention, (1) a field-emission type electron source includes: a needle obtained by sharpening one of tips of a rod-like 1-crystal tungsten, and having zirconia formed to a predetermined thickness and a predetermined length on a side outer portion thereof as a diffusion and supply source, the one of the tips having a crystal plane (100); heating means for the needle; and a suppressor electrode, wherein in the field-emission type electron source that allows electrons to be emitted by heating the needle to apply an electric field to the tip of the needle, when a length of the diffusion and supply source is L and a maximum thickness of the diffusion and supply source is t, $t/L<3/50$, and a minimum thickness thereof is greater than or equal to 10 μm.

(2) The field-emission type electron source includes one or a plurality of diffusion and supply sources with a length L of 500 μm or more.

(3) A thickness t of the diffusion and supply source is 40 μm or less.

(4) The diffusion and supply source is formed in a direction going toward an other tip of the needle, from a position 300 μm away from the tip of the needle.

(5) A plurality of diffusion and supply sources with a length of less than 500 μm are connected to each other, and space between the connected diffusion and supply sources is 50 μm or less, a cross-sectional form of the diffusion and supply sources being a projection-like form with a maximum thickness t of 40 μm or less.

(6) A plurality of diffusion and supply sources are connected to each other, and a minimum thickness of the diffusion and supply sources at the connected portion is 10 μm or more, a cross-sectional form of the diffusion and supply sources being projection-like and having a maximum thickness t of 40 μm or less.

(7) A plurality of diffusion and supply sources are wound around the side outer portion of the needle in spiral form, and space between the adjacent wound diffusion and supply sources is 50 μm or less, a cross-sectional form of the diffusion and supply sources being projection-like and having a maximum thickness t of 40 μm or less.

(8) A plurality of diffusion and supply sources having a linear form with a length of 500 μm or more are disposed on the side outer portion of the needle, and space between the adjacent diffusion and supply sources is 50 μm or less, a cross-sectional form of the diffusion and supply sources being projection-like and having a maximum thickness of 40 μm or less.

(9) A plurality of diffusion and supply sources having a linear form with a length of 500 μm or more are disposed on the side outer portion of the needle, and a minimum thickness of the adjacent diffusion and supply sources is 10 μm or more, a cross-sectional form of the diffusion and supply sources being projection-like and having a maximum thickness of 40 μm or less.

(10) A plurality of diffusion and supply sources are disposed on the side outer portion of the needle, and space between the plurality of dense diffusion and supply sources is 50 μm or less, a cross-sectional form of the diffusion and supply sources being projection-like and mountain-shaped and having a maximum thickness of 40 μm or less.

Advantageous Effects of Invention

According to the present invention, a field-emission type electron source (Schottky electron source) can be provided that achieves a life of 8,000 hours or more under continuous use condition at 1800 K heating and with a lesser volume of a diffusion and supply source than those of conventional ones, and that has very few chips or cracks in the diffusion and supply source (zirconia), and that has very little damage to a tungsten needle.

DESCRIPTION OF EMBODIMENTS

In the present invention, means for efficiently extending life has been found from the process in which zirconia is consumed.

Accelerated evaluation of zirconia consumption conditions is experimentally made by heating zirconia to a temperature of 2000 K which is higher by the order of 200 K than normal. In the evaluation, by measuring each of heating time h, consumption volume ΔV (total volume V), and the ratio R between the amounts of gas emitted at 1800 K heating and 2000 K heating, life L at 1800 K heating is estimated by L=V/ΔV×h×R.

Figure 10:
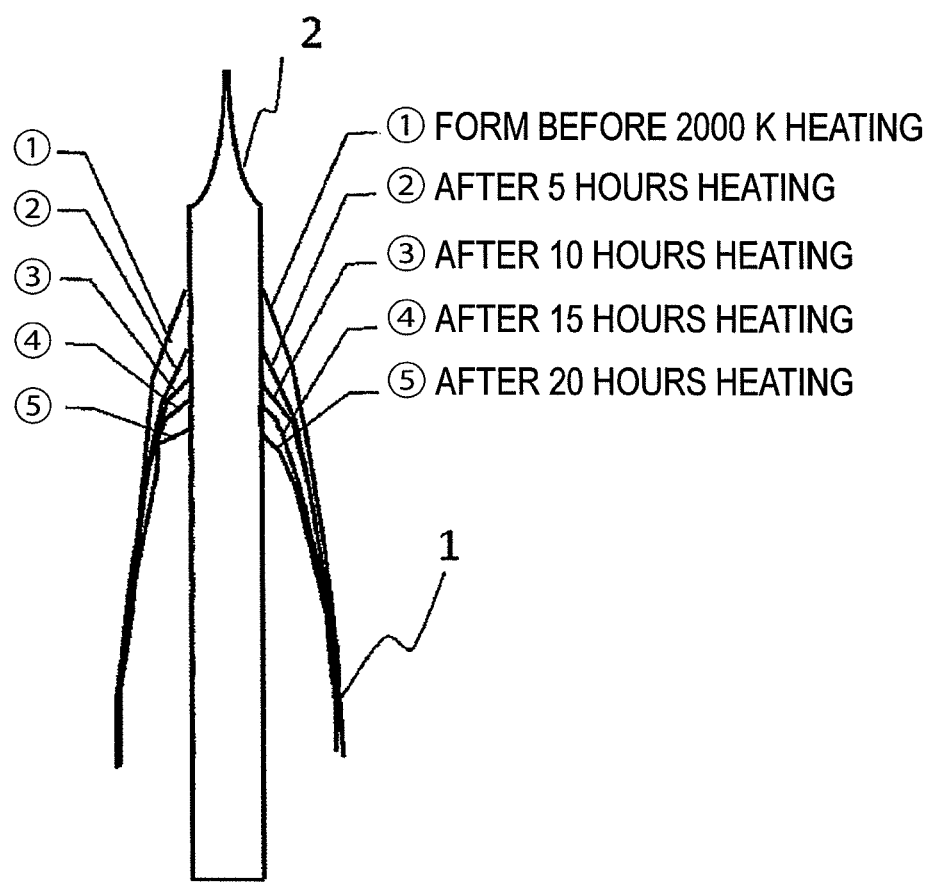
FIG. 10 is a diagram describing the consumption characteristics of a zirconia diffusion and supply source.

2000 K heating is repeated every 5 hours up to 25 hours, and the forms of a diffusion and supply source 1 at that time are recorded. As a result, it has been found that, as shown in FIG. 10, supply from the diffusion and supply source 1 to a tungsten surface mainly starts from an edge portion of zirconia which is the diffusion and supply source 1, and the thicknesses of other portions of the zirconia do not change almost at all. Furthermore, it has been confirmed by another experiment that the same result is obtained even under the condition that electrons are emitted by applying an electric field at 1800 K which is a practical heating temperature. From this fact, consumption by, for example, evaporation from the zirconia itself is little, but consumption from the edge portion of the zirconia such as diffusion of the zirconium to the tungsten surface is more dominant.

The form of zirconia is studied using the following three types of samples. A sample serving as a reference is called a reference sample, a sample in which the volume of zirconia is doubled by increasing the thickness of the zirconia is called type A, and a sample in which the volume is doubled by increasing the length of zirconia is called type B. The consumption characteristics of the three types are evaluated.

Figure 11A:
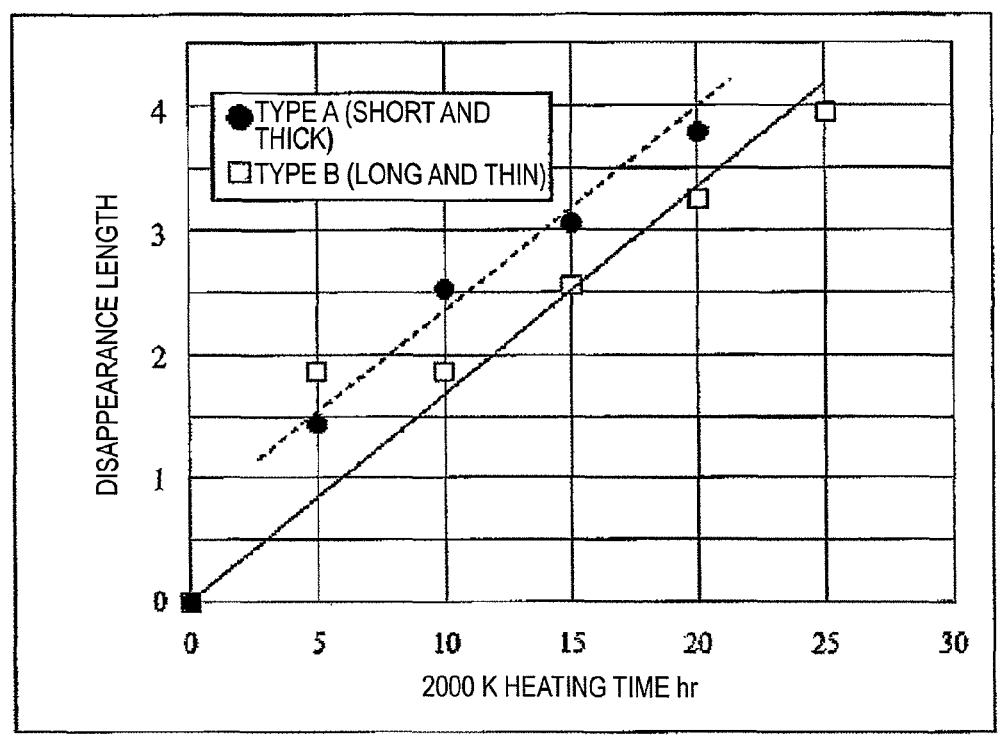
FIG. 11A is a diagram showing a relationship between 2000 K heating time and the consumption characteristics in a length direction of zirconia diffusion and supply sources.
Figure 11B:
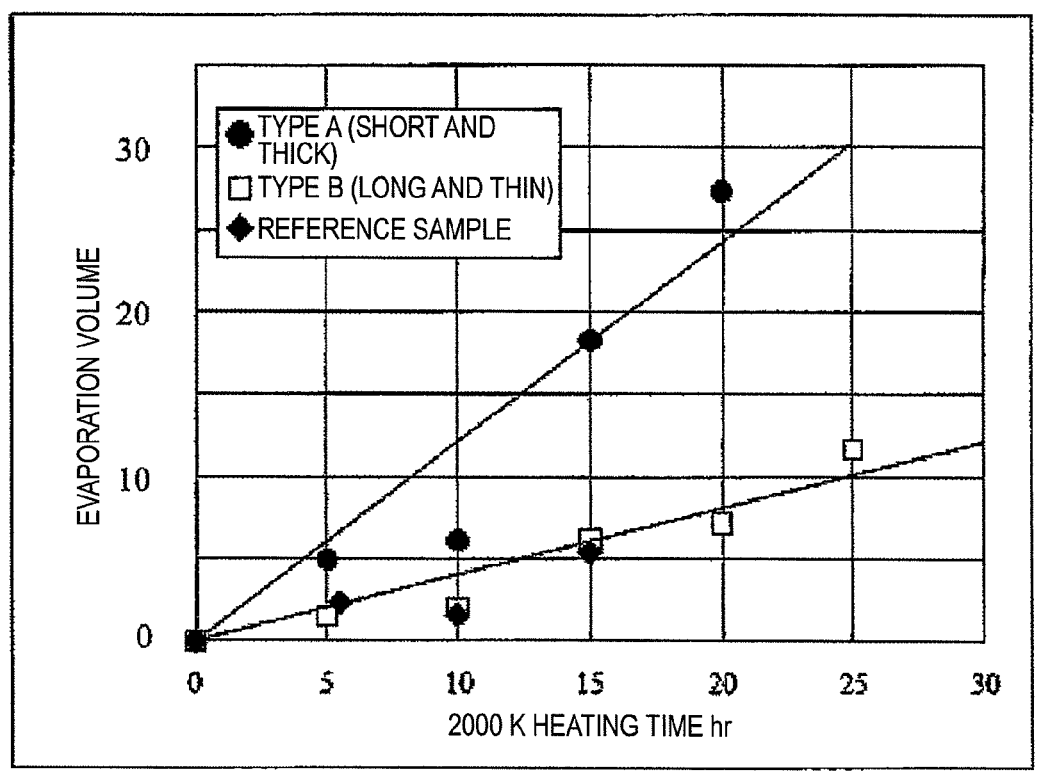
FIG. 11B is a diagram describing a relationship between 2000 K heating time and volume of zirconia diffusion and supply sources.

As a result, it has been found that, as shown in FIG. 11A, the disappearance in the length direction for 2000 K heating time exhibits a tendency independent of thickness, and as shown in FIG. 11B, the disappearance of volume for 2000 K heating time has a tendency that the thicker the thickness the faster the disappearance.

Figure 12:
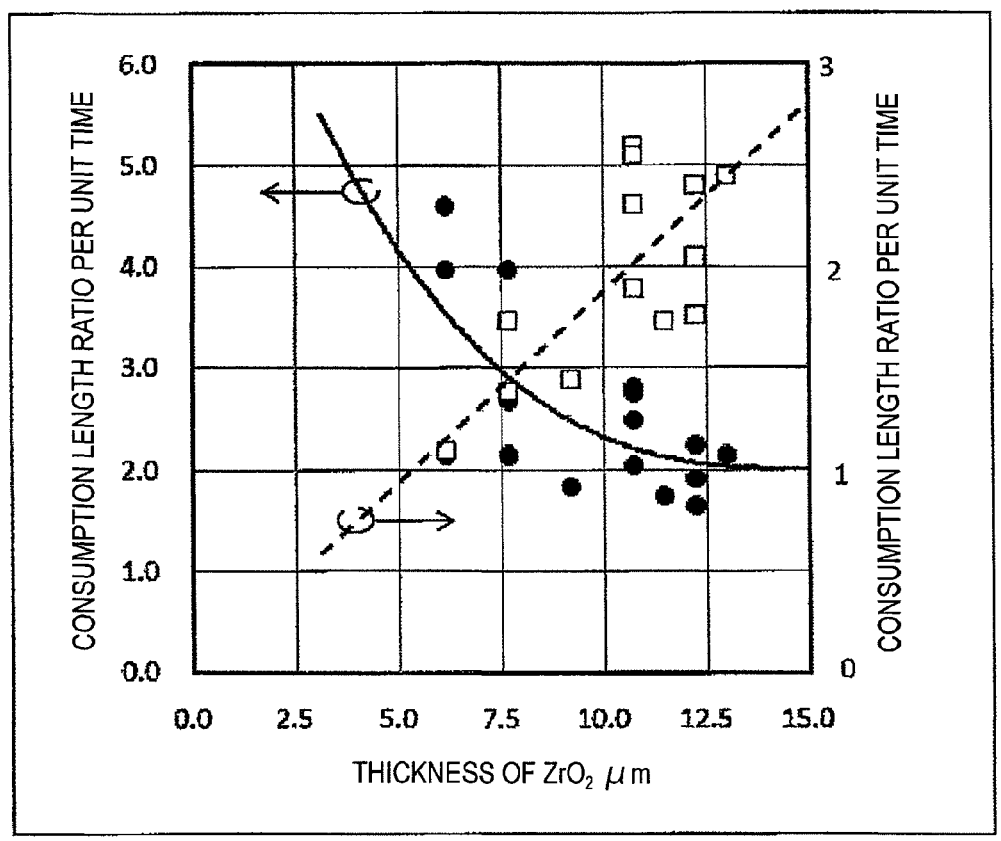
FIG. 12 is a diagram describing a relationship between thickness, consumption length, and volume of the zirconia diffusion and supply sources.

Furthermore, an experiment such as that shown below is conducted to specifically study a relationship between thickness and consumption speed. A zirconia cross-section of an evaluated sample before heating is thin at its edge and is thicker as it goes to its center. FIG. 12 shows those data rearranged as the amounts of disappearance for each thickness. From the graph, it has been found that the consumption length per unit time increases when the thickness is thinner than 10 μm, but has a tendency to converge to a certain value when the thickness exceeds 10 μm. On the other hand, the consumption volume per unit time increases proportionally to the thickness. Therefore, under 2000 K heating condition, excellent efficiency is obtained when the minimum thickness is set to 10 μm, resulting in a long-life field-emission type electron source. The minimum thickness is a value that is determined depending on the heating temperature. It has been found by another experiment that the minimum thickness is 6 to 8 μm for 1800 K, and 4 to 6 μm for 1700 K. This indicates that an oxidation-reduction reaction occurs at an interface between tungsten and zirconia, but if the zirconia is sufficiently thick, evaporation here is not noticeable. This phenomenon is described as follows. The diffusion length of tungsten atoms or zirconium in zirconia or the physical quantity of diffusion rate depends on the temperature. On the other hand, if the zirconia has a sufficient thickness, it behaves as bulk. If the thickness is thinner than a certain thickness, evaporation from here becomes noticeable.

There are known several methods for forming zirconia on a side outer portion of a tungsten needle. In many cases, a slurry-like gel where zirconia or zirconium fine particles or zirconium hydride is mixed in an organic solvent or the like is allowed to be adhered to a side outer portion of a tungsten needle, using a tool like an ink brush, a dropper, or a syringe, and then is heated in a vacuum state and sintered. In the case of zirconium or zirconium hydride, the process of performing oxidization by, for example, heating in oxygen gas is added thereafter. In such a method, variations in zirconia thickness on the order of 20 to 30 μm may occur. Thus, it can be said that the practical zirconia thickness is 8 to 40 μm for 1800 K heating, and 6 to 40 μm for 1700 K heating. More desirably, the practical zirconia thickness is 8 to 30 μm for 1800 K heating, and 6 to 30 μm for 1700 K heating. The thickness range is thinner than the thickness of zirconia (on the order of 60 μm) which is formed in a conventional field-emission type electron source with a life of 8000 hours or more at 1800 K, and thus, also provides the effect of being able to significantly reduce the risk of occurrence of chips or cracks. For practical purposes, when the minimum value of zirconia thickness is set to 10 μm, a form can be obtained that has an efficient zirconia volume, with sufficient life ensured at any temperature from 1700 K to 1800 K. In addition, damage to the tungsten needle can be reduced.

Next, a zirconia length that is effective for life extension will be described. There are two factors related to the length. The first factor is the amount of oxygen atoms accumulated in zirconia, and the second factor is the temperature distribution of a heated tungsten needle.

For the amount of absorbable oxygen atoms which is the first factor, zirconia has a property that, when zirconia is heated for sintering, oxygen is emitted, causing loss in the lattice. If oxygen decreases too much, metallic zirconium appears. Hence, there is a need to introduce oxygen gas to bring it back to zirconia. Zirconium is oxidized to zirconia by introducing oxygen atoms around the diffusion and supply source, the efficiency of which is more advantageous with a wider and thinner surface area. It can also be said that it is advantageous for life extension when a wide surface area is taken by thinning and lengthening the form of formation of zirconia. This fact becomes clear by looking at the above-described gas ratio R obtained in the experiment using the three types of samples. Specifically, the gas ratio R is the ratio between the amount of increase in pressure by gas emitted by the electron source at 1800 K heating (normal use temperature) and the amount of increase in pressure at 2000 K heating. At 2000 K heating, it is difficult to form a diffusion layer on the tungsten surface, and zirconia becomes a gas from its edge and disappears immediately after diffusion. Thus, at that point in time, a numerical value that represents the total amount of substance that the zirconia can supply is obtained. It may be said that the gas ratio R which is the ratio between the pressure and the amount of increase in pressure by gas emission at 1800 K heating which is a temperature used in practice is the representative value of the number of oxygen atoms possessed by the electron source. In comparison with the reference sample, type A obtains a value about 5 times as high, and type B obtains a value about 6 times as high. It is considered that, since sintered zirconia is porous, in type A the surface area is increased for the amount of increase in thickness. In type B, the length is 2 times that of the reference sample and thus the surface area is supposed to be 2 times, but the gas ratio is as large as 6 times. This is considered to be caused by the appearance of a phenomenon which will be described next, in addition to the previously described fact that zirconium turns into zirconia due to oxidization by introduction of oxygen gas. Specifically, as described in PTL 2, it has been found that there is a large amount of oxygen on the tungsten surface, in particular, when there is zirconium, near an interface therebetween. From this fact, oxygen is supposed to be also present at an interface between zirconia which is the diffusion and supply source and tungsten. It is considered that, by widely taking the region where oxygen is present, the amount of oxygen atoms per unit area that can be accumulated is increased by about 3 times that of the reference sample. From this factor, too, it can be said that increasing the area covering tungsten results in the form of formation of zirconia which is extremely advantageous for life extension. Specifically, in the case of type B, since the gas ratio R is 6 times and the length L of the diffusion and supply source is 2 times, overall, long life as long as 12 times=6×2 times that of the reference sample can be obtained.

Figure 3:
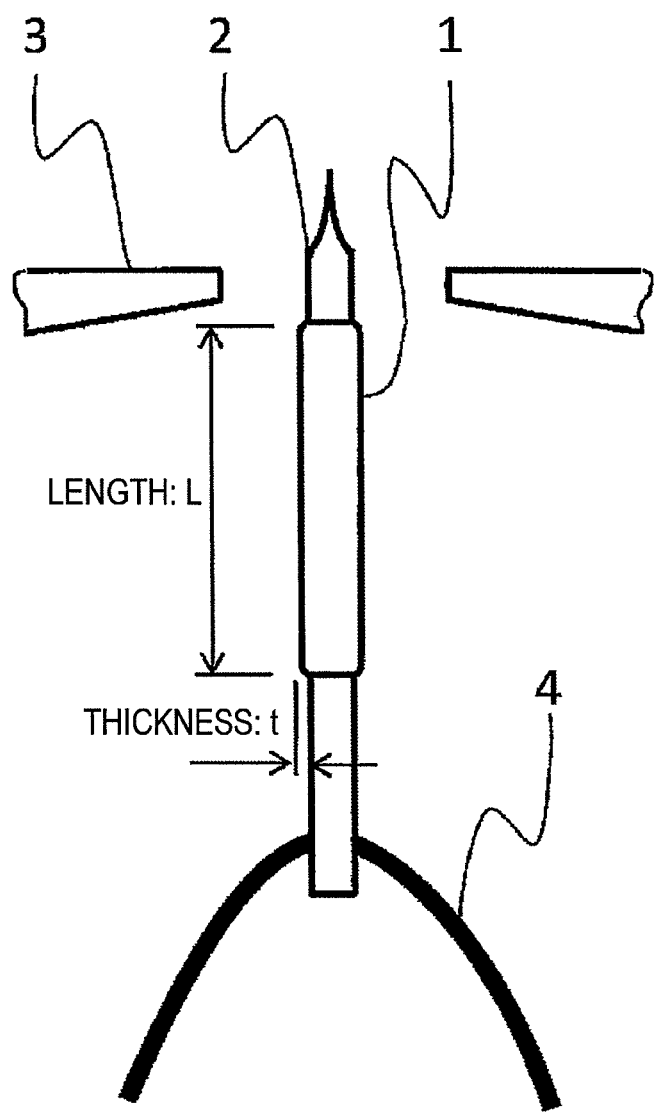
FIG. 3 is a diagram describing a configuration of an field-emission type electron source.
Figure 14A:
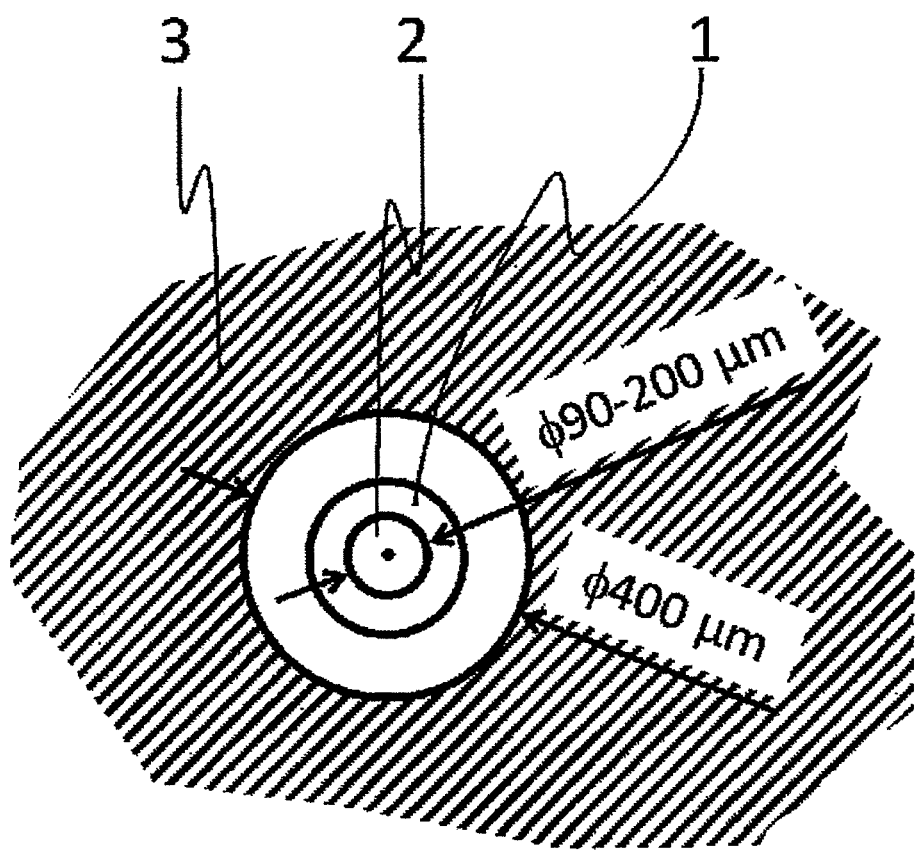
FIG. 14A is a plan view describing a positional relationship between a tungsten needle, a zirconia diffusion and supply source, and a suppressor electrode of the present invention.
Figure 14B:
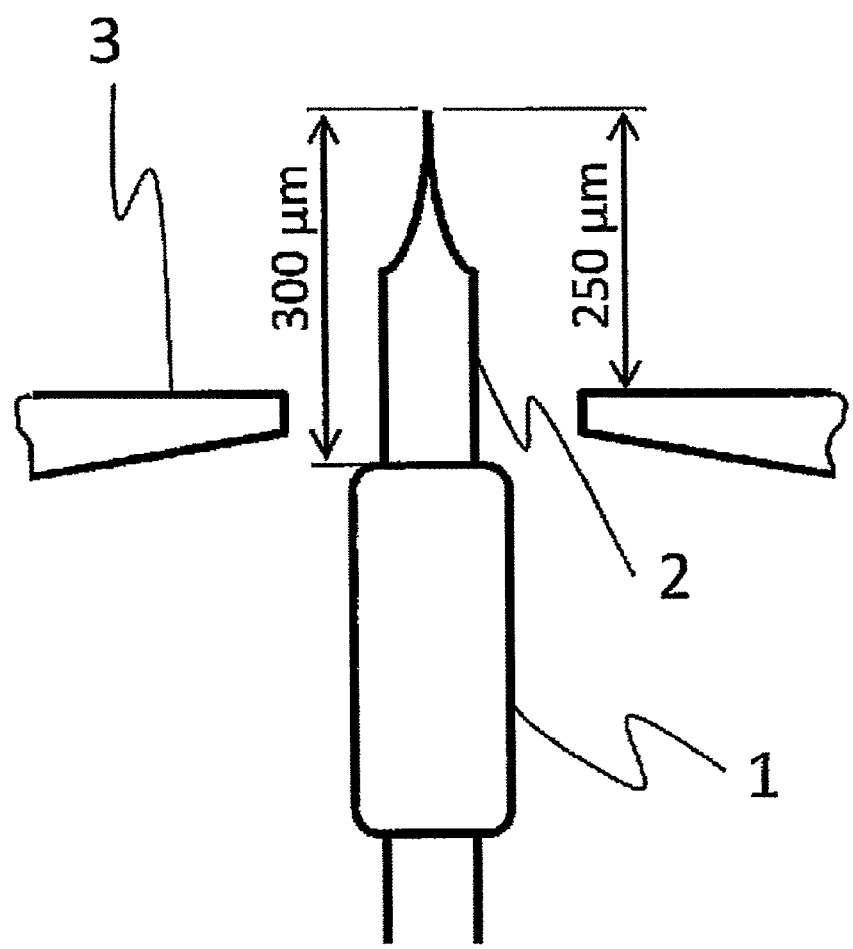
FIG. 14B is an elevational view describing a positional relationship between the tungsten needle, the zirconia diffusion and supply source, and the suppressor electrode of the present invention.

The second viewpoint related to the length of zirconia formation is the temperature distribution of a tungsten needle 2. The structure of a field-emission type electron source is such that, as shown in FIG. 3, a tungsten needle 2 is spot-welded to a heating hairpin 4. A constant current is allowed to flow through the hairpin 4 to heat the tungsten needle 2. Thus, the temperature is high at the base of the needle, and decreases as it goes toward the needle tip. Normally, the electron source is used by setting the temperature at the needle tip to 1700 to 1800 K, but the temperature at the base at that time is 1750 to 1880 K, and the temperature distribution from the base to the tip is distributed substantially linearly. Hence, there is a characteristic that the closer it gets to the tip, the lower the temperature. Specifically, as shown in FIG. 14B, the tip of the tungsten needle 2 of the field-emission type electron source is fixed so as to protrude on the order of 250 from a suppressor electrode 3. Thus, in order to avoid contact of zirconia with the suppressor electrode 3, the zirconia is provided closer to the hairpin side than the position of the suppressor electrode 3. The position of the zirconia may be 300 μm or more away from the tip of the tungsten needle 2.

Here, diffusion of zirconia is greatly influenced by temperature, and is more promoted with a higher temperature. It can also be said that the higher the temperature, the higher the consumption speed. Therefore, forming a diffusion and supply source (zirconia) near the hairpin reduces life, and forming a diffusion and supply source near the needle tip can extend life.

It has become clear from the studies so far that type B can further extend life. Specific estimated life is 0.5 years for the reference sample (the length of the diffusion and supply source is 350 μm) under 1800 K heating condition, 6 years for type B (the length of the diffusion and supply source is 700 μm), and 1 year for type A (the length of the diffusion and supply source is 350 μm). Furthermore, the life of the reference sample in the case of a heating temperature of 1700 K is 3.5 years, 10 years or more for type B, and 7 years for type A.

Figure 13:
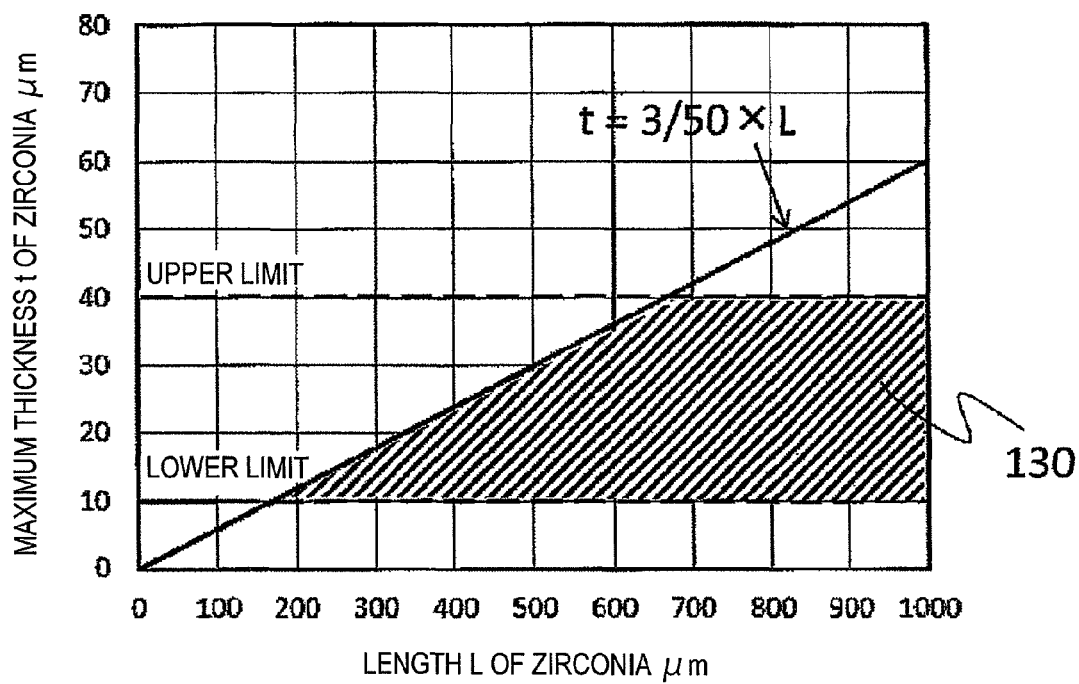
FIG. 13 is a diagram describing a range for the form of a zirconia diffusion and supply source of the present invention.

The form of a diffusion and supply source for obtaining a long-life field-emission type electron source can be expressed in a standardized representation as follows. Specifically, when, as shown in FIG. 3, the length of a diffusion and supply source 1 is L and the maximum thickness is t, a diffusion and supply source is formed in a thin and long region which satisfies t/L<3/50. That is, when, as shown in FIG. 13, the horizontal axis is the length L of zirconia and the vertical axis is the maximum thickness t of zirconia, a zirconia form that meets the conditions of a range 130 indicated by hatching, that is, a range surrounded by t<3/50×L and a lower limit value of t of 10 μm and an upper limit value of t of 40 μm, is formed.

Figure 15:
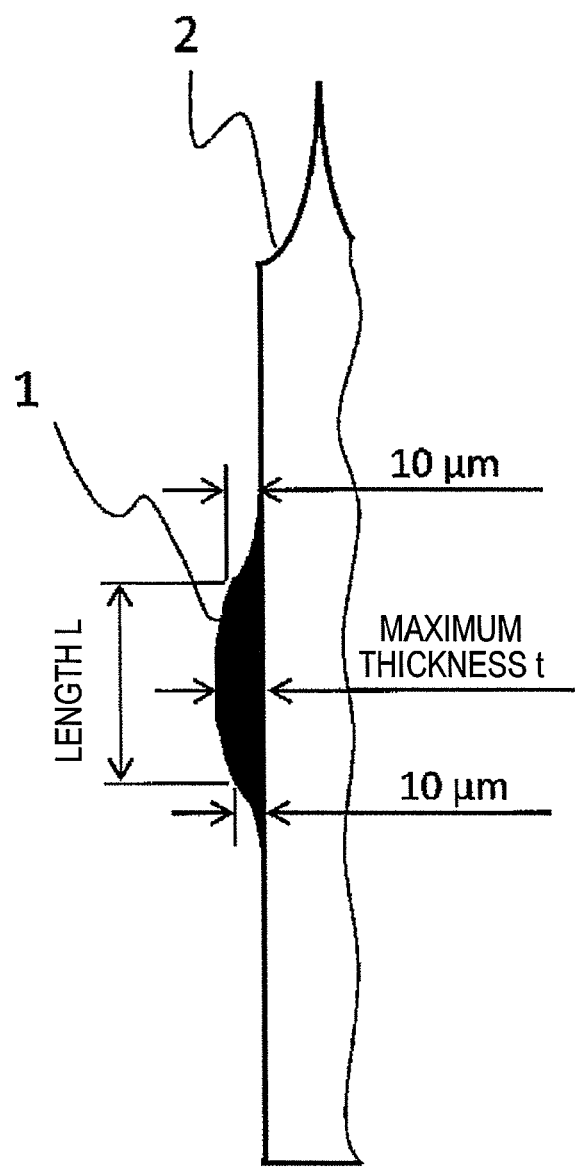
FIG. 15 is a diagram describing the thickness and length of the zirconia diffusion and supply source of the present invention.

Furthermore, when the lower limit value of the length of zirconia is set to 500 μm, life exceeding 8000 hours can be obtained even under 1800 K heating condition, and thus, it is more desirable. FIG. 15 shows this form in a more easy to understand manner. The length of zirconia in a range in which the minimum thickness of the zirconia is 10 μm or more is L, and the maximum thickness is t.

Embodiments of the present invention will be described in detail below with reference to the drawings.

First Embodiment

In the present embodiment, a field-emission type electron source using the present invention will be described in detail.

Figure 1:
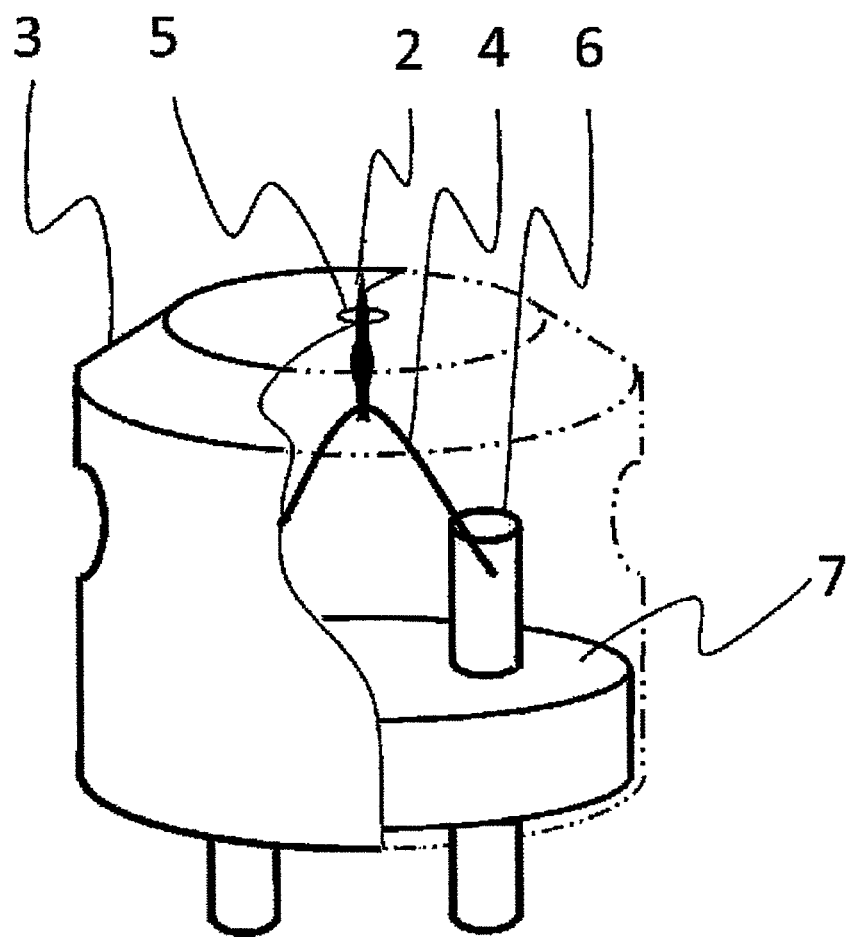
FIG. 1 is a diagram describing a representative electron source configuration of the present invention.
Figure 2:
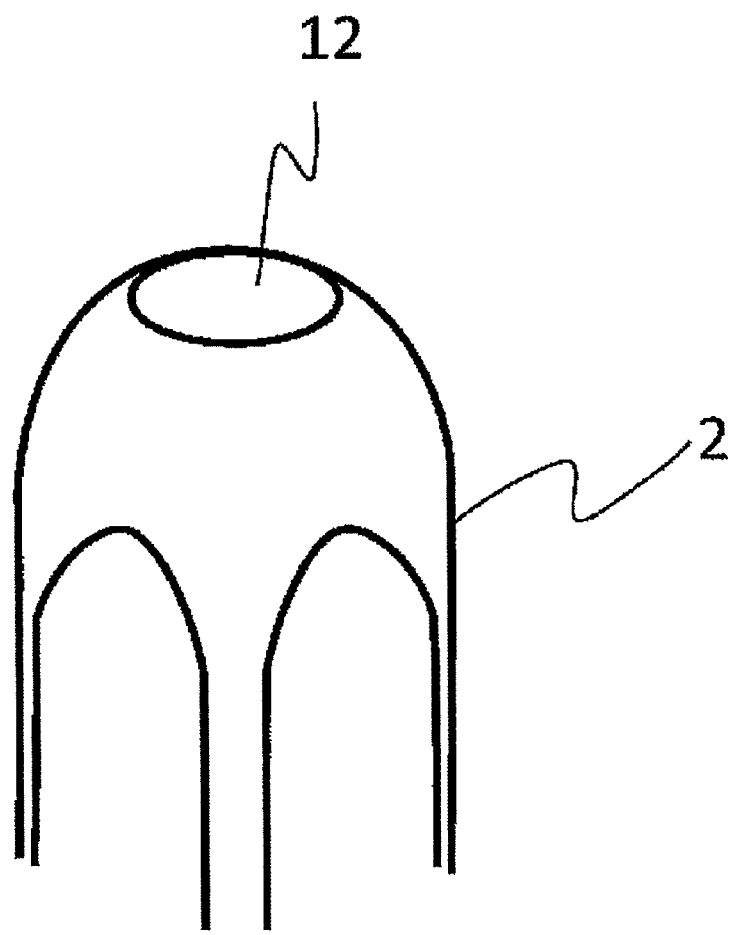
FIG. 2 is a diagram describing the configuration and form of a representative configuration example of the present invention as viewed from the top surface.

FIG. 1 shows an overall configuration of a field-emission type electron source. Portions of a heating hairpin 4 (tungsten) near its both ends are spot-welded to two stems 6 which are fixed to an insulating insulator 7. An end of a single-crystal tungsten rod that is on the opposite side of a portion of a needle 2 which is obtained by sharpening a tip of the single-crystal tungsten rod is spot-welded to a curved central portion of the hairpin 4. As shown in FIG. 2, a tip of the needle has an opening in a (100) plane. As shown in FIG. 3, a diffusion and supply source 1 is formed on a side outer portion of the needle. A detail of the diffusion and supply source 1 will be described later. The insulating insulator 7, the stems 6, the heating hairpin 4, and the tungsten needle 2 are covered by a suppressor electrode 3. The suppressor electrode 3 has a reversed cup-type structure and has a circular opening portion 5 at a central portion of the bottom of the cup. The tip portion of the tungsten needle 2 is fixed so as to stick out of the opening portion 5.

A desired form of the diffusion and supply source 1 is such that, as shown in FIG. 3, the diffusion and supply source 1 is stuck to the side outer portion of the tungsten needle 2 in a cylindrical form with a uniform thickness, and the thickness thereof is adjusted according to the heating temperature to be used. For example, the thickness is 8 μm when the diffusion and supply source 1 is used at 1800 K, and 6 μm when used at 1700 K. The length thereof is 400 μm, desirably 500 μm or more. In practice, variations occur in the thickness of the diffusion and supply source 1 depending on the formation method, and thus, devices therefor are required.

Hence, the case will be described in which formation of the diffusion and supply source 1 uses a method in which a solution where zirconia fine particles are mixed in an organic solvent is allowed to be adhered to the side outer portion of the tungsten needle 2 using a dropper, and is heated under vacuum and sintered. A solution where zirconium hydride fine particles are mixed in an organic solvent, which is another method, may be allowed to be adhered by the same method.

Figure 4:
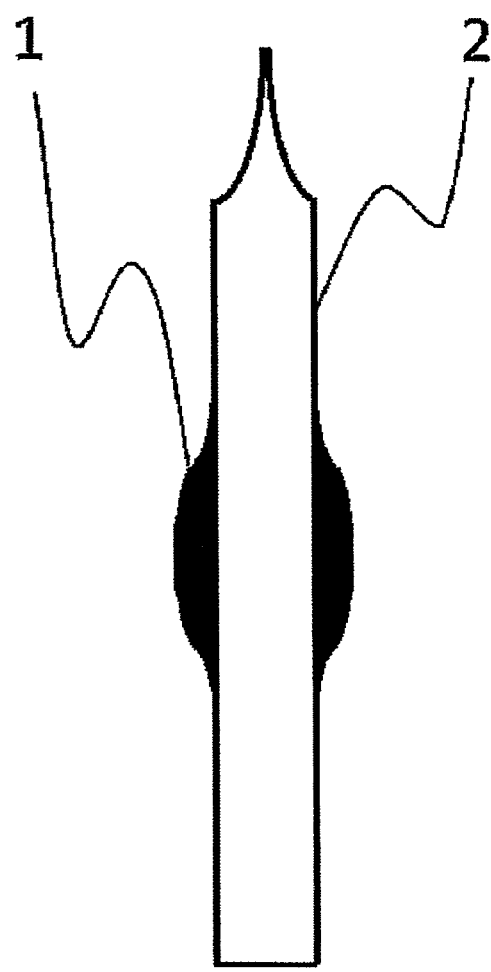
FIG. 4 is a diagram describing a tip portion of a tungsten needle of the field-emission type electron source.

In such a formation method, the diffusion and supply source 1 is formed on the side outer portion of the tungsten needle 2 in belly-band form, and the cross-sectional form thereof is mountain-like such as that shown in FIG. 4. Hence, a method such as that shown below is used so that the thickness and the length fall within a certain range. With the maximum thickness being 30 μm, the length after sintering at this time is determined. In this experiment, the length of the diffusion and supply source 1 per adhesion is 330 μm.

Figure 5:
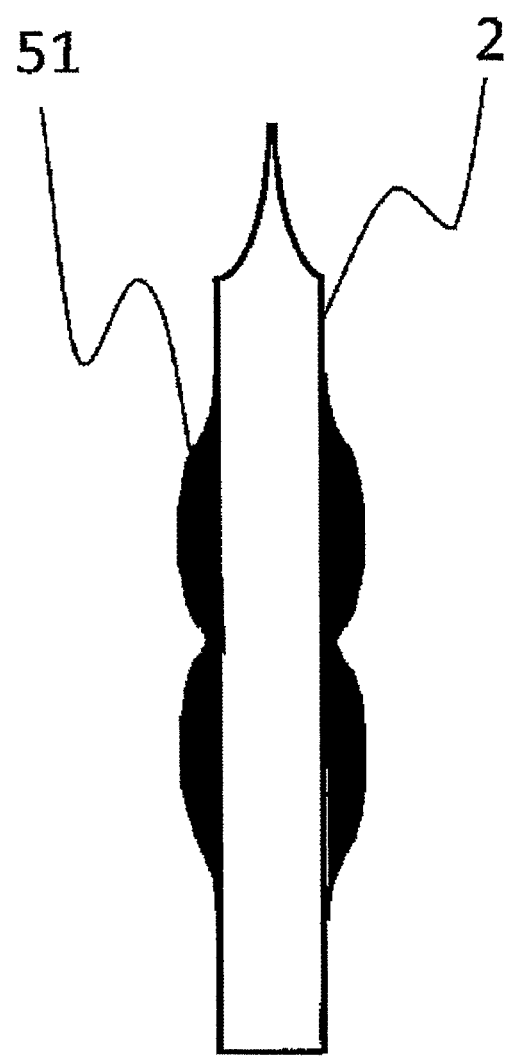
FIG. 5 is a diagram describing a standard cross-sectional form of a diffusion and supply source.

Hence, in order to form a length of 600 μm, as shown in FIG. 5, two adhesions are sintered in series on a side outer portion of a tungsten needle so as to partially overlap each other. By employing such a method, a zirconia diffusion and supply source 51 with a minimum thickness of 10 μm and a maximum thickness of 30 μm can be formed in a desired region. The cross-section thereof is as shown in FIG. 5, and has two cycles with an amplitude of 20 μm and between 10 and 30 μm of thickness.

Figure 6:
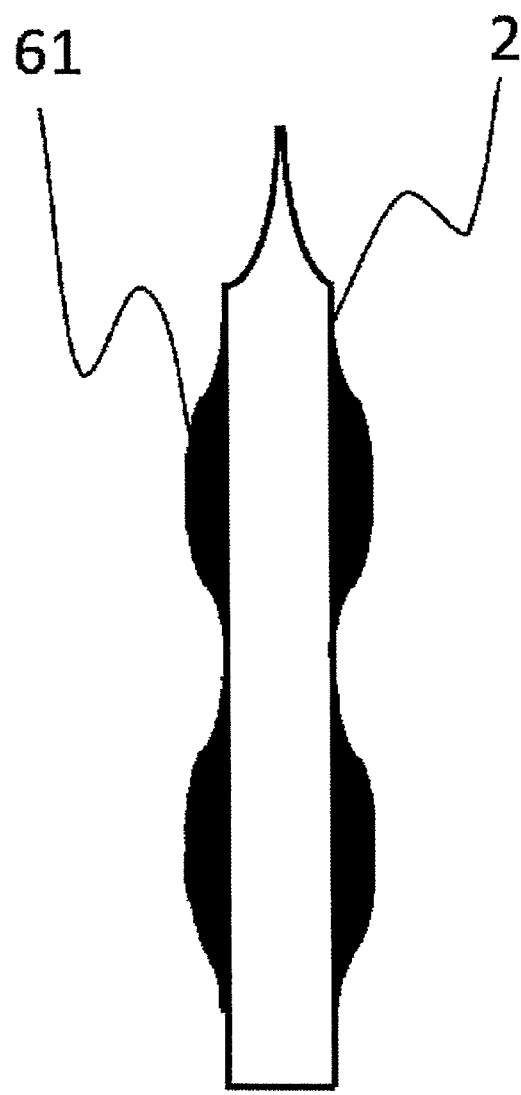
FIG. 6 is a diagram describing an embodiment of the present invention.

Furthermore, as shown in FIG. 6, two diffusion and supply sources 61 are formed with a space of 50 μm or less created therebetween. Even if such space is provided, a substantially equivalent life-extending effect can be obtained. Moreover, by forming zirconia thinner in thickness than that of conventional ones, there is an effect of reducing chips, cracks, damage to the tungsten needle 2, etc., which are caused by a change in the volume of the zirconia (thermal expansion or a change in crystalline structure) due to heating.

The diffusion and supply sources 51 and 61 are formed on the side outer portion of the tungsten needle 2, and the positions thereof are in a region extending 600 μm from a position 300 μm away from the tip of the tungsten needle 2. The positions are lower than the opening portion 5 of the suppressor electrode 3 shown in FIG. 1, and do not reach the exposed tip of the tungsten needle 2. Enlarged views are shown in FIGS. 14A and 14B. FIG. 14A is a plan view of the suppressor electrode 3 as viewed from the tip side of the tungsten needle 2. FIG. 14B is an elevational view of the tungsten needle 2 as viewed in the longitudinal direction thereof. The diffusion and supply sources 51 and 61 can also be disposed on a side outer portion of the needle that also includes the exposed portion of the tungsten needle 2. However, since the probability of occurrence of chips in the diffusion and supply sources 51 and 61 or of generation of foreign matter increases due to the diffusion and supply sources 51 and 61 coming into contact with the suppressor electrode 3, it is desirable that the diffusion and supply sources 51 and 61 not be exposed outside from the opening portion 5. Therefore, the diffusion and supply sources 51 and 61 are formed so as to be located 300 μm or more away from the tip of the tungsten needle 2.

The suppressor electrode 3 is positioned in a predetermined position and then fixed to the tungsten needle 2 formed in the above-described manner, by which a field-emission type electron source is formed. The field-emission type electron source formed in the above-described manner is mounted on an electron gun and is heated to 1800 K, and a predetermined extraction voltage is applied thereto to apply a predetermined electric field to the tip of the tungsten needle 2. As a result, electrons are emitted normally, and stable electron emission continues over 8,000 hours. In addition, there are no cracks or chips in the diffusion and supply sources 51 and 61.

It has been found that, if it is predetermined that an electron source by formation of a diffusion and supply source of the present embodiment is used at a heating temperature of 1700 K, then the minimum thickness can be set to 6 μm, and moreover, extremely long life exceeding 10 years can be obtained.

Second Embodiment

In the present embodiment, the forms of formation of a diffusion and supply source which are different from those of the first embodiment will be described.

Figure 7:
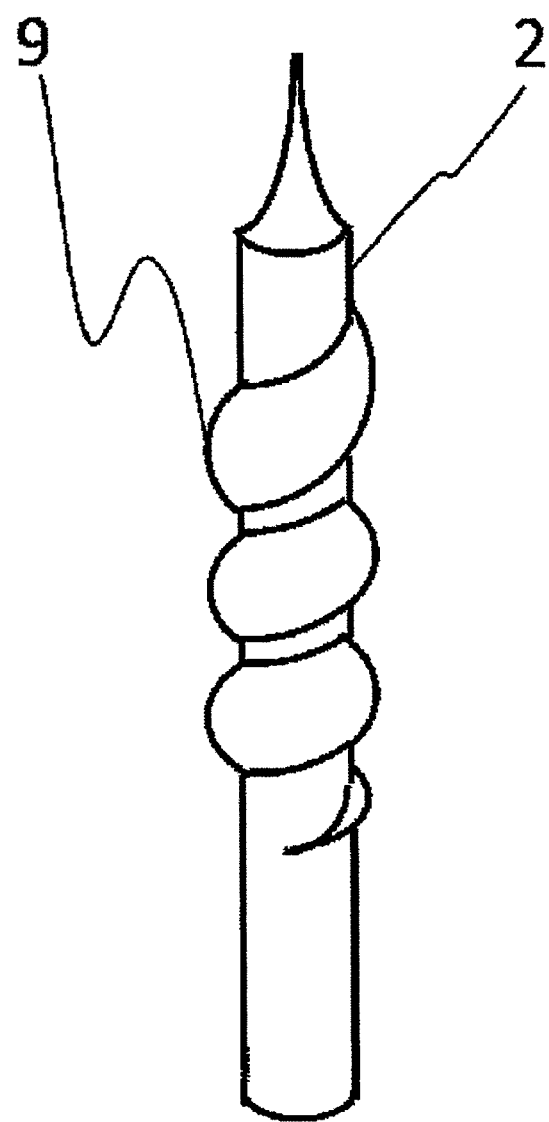
FIG. 7 is a diagram describing another embodiment of the present invention.

When a solution where zirconia fine particles are mixed in an organic solvent is allowed to be adhered to a side outer portion of a tungsten needle using a dropper in the same manner as in the first embodiment, as shown in FIG. 7, a tungsten needle 2 is rotated about its axial direction, and at the same time, the dropper is allowed to scan in the axial direction of the tungsten needle 2, by which diffusion and supply sources 9 are formed in spiral form. At this time, the scanning may be performed so as to maintain a minimum thickness of 10 μm without exposing the tungsten surface by not creating space between adjacent diffusion and supply sources 9, or the scanning may be performed such that the space is 50 μm or less. Thereafter, sintering under vacuum may be performed.

Figure 8:
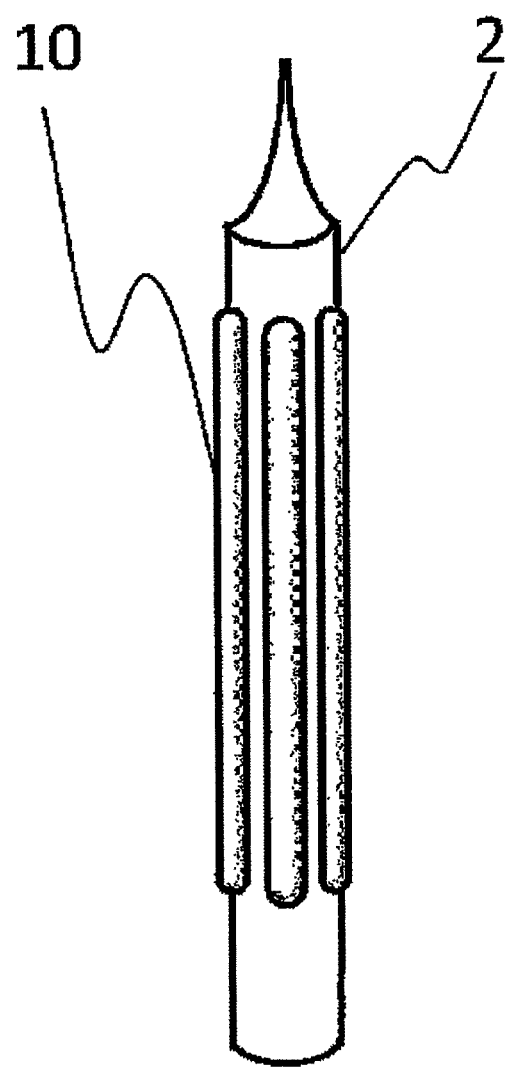
FIG. 8 is a diagram describing still another embodiment of the present invention.

Furthermore, as shown in FIG. 8, a solution may be allowed to be adhered linearly along an axial direction of a tungsten needle 2, and may be further allowed to be adhered in a line adjacent thereto, and further in a line adjacent thereto, which may be repeated until a side outer portion of the tungsten needle is covered. At this time, a space of 50 μm or less may be provided, or without providing space, diffusion and supply sources 10 may overlap each other such that the minimum thickness is 10 μm.

Figure 9:
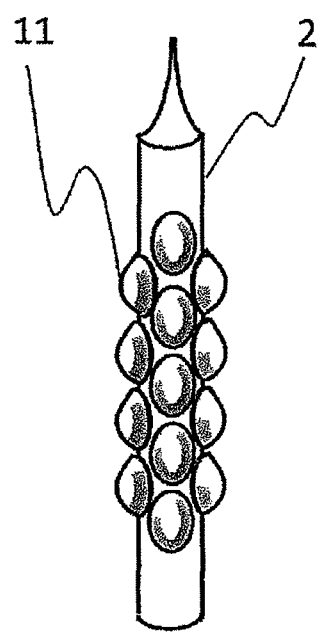
FIG. 9 is a diagram describing yet another embodiment of the present invention.

In addition, as shown in FIG. 9, a plurality of mountain-shaped projection forms may be formed. For space between diffusion and supply sources 11, as in the embodiments described so far, space may be created provided that the space is 50 μm or less, or the diffusion and supply sources 11 may overlap each other such that the minimum thickness is 10 μm.

In addition to the above-described forms, there may be various formation examples. Any form such as a ring form and a streak form may be employed, and the same effect can be obtained as long as the form is formed within the region indicated by the present invention.

REFERENCE SIGNS LIST

1, 51, and 61 diffusion and supply source
2 tungsten needle
3 suppressor electrode
4 hairpin
5 opening portion of suppressor electrode
6 stem
7 insulating insulator
8 diffusion and supply source
9 diffusion and supply source
10 diffusion and supply source
11 diffusion and supply source

The invention claimed is:

1. A field-emission type electron source comprising: a needle obtained by sharpening one of tips of a rod-like single-crystal tungsten, and having zirconia formed to a predetermined thickness and a predetermined length on a side outer portion thereof as a diffusion and supply source, the one of the tips having a crystal plane (100); heating means for the needle; and a suppressor electrode, wherein
in the field-emission type electron source that allows electrons to be emitted by heating the needle to apply an electric field to the tip of the needle, when a length of the diffusion and supply source is L and a maximum thickness of the diffusion and supply source is t, t/L<3/50, and the thickness of the diffusion and supply source is in a range greater than or equal to 10 μm.

2. The field-emission type electron source according to claim 1, comprising one or a plurality of diffusion and supply sources with a length L of 500 μm or more.

3. The field-emission type electron source according to claim 1, wherein the maximum thickness t of the diffusion and supply source is 40 μm or less.

4. The field-emission type electron source according to claim 1, wherein the diffusion and supply source is formed in a direction going toward an other tip of the needle, from a position 300 μm away from the tip of the needle.

5. The field-emission type electron source according to claim 1, wherein a plurality of diffusion and supply sources with a length of less than 500 μm are connected to each other, and space between the connected diffusion and supply sources is 50 μm or less, a cross-sectional form of the diffusion and supply sources being a projection-like form with a maximum thickness t of 40 μm or less.

6. The field-emission type electron source according to claim 1, wherein a plurality of diffusion and supply sources are connected to each other, and a minimum thickness of the diffusion and supply sources at the connected portion is 10 µm or more, a cross-sectional form of the diffusion and supply sources being projection-like and having a maximum thickness t of 40 µm or less.

7. The field-emission type electron source according to claim 1, wherein a plurality of diffusion and supply sources are wound around the side outer portion of the needle in spiral form, and space between the adjacent wound diffusion and supply sources is 50 µm or less, a cross-sectional form of the diffusion and supply sources being projection-like and having a maximum thickness t of 40 µm or less.

8. The field-emission type electron source according to claim 1, wherein a plurality of diffusion and supply sources having a linear form with a length of 500 µm or more are disposed on the side outer portion of the needle, and space between the adjacent diffusion and supply sources is 50 µm or less, a cross-sectional form of the diffusion and supply sources being projection-like and having a maximum thickness of 40 µm or less.

9. The field-emission type electron source according to claim 1, wherein a plurality of diffusion and supply sources having a linear form with a length of 500 µm or more are disposed on the side outer portion of the needle, and a minimum thickness of the adjacent diffusion and supply sources is 10 µm or more, a cross-sectional form of the diffusion and supply sources being projection-like and having a maximum thickness of 40 µm or less.

10. The field-emission type electron source according to claim 1, wherein a plurality of diffusion and supply sources are disposed on the side outer portion of the needle, and space between the plurality of dense diffusion and supply sources is 50 µm or less, a cross-sectional form of the diffusion and supply sources being projection-like and mountain-shaped and having a maximum thickness of 40 µm or less.

* * * * *